United States Patent
Okayama et al.

(10) Patent No.: US 7,235,469 B2
(45) Date of Patent: Jun. 26, 2007

(54) SEMICONDUCTOR DEVICE AND METHOD FOR MANUFACTURING THE SAME

(75) Inventors: Yasunori Okayama, Fujisawa (JP); Kiyotaka Miyano, Fujisawa (JP); Kazunari Ishimaru, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 192 days.

(21) Appl. No.: 10/998,193

(22) Filed: Nov. 29, 2004

(65) Prior Publication Data

US 2006/0065934 A1    Mar. 30, 2006

(30) Foreign Application Priority Data

Sep. 29, 2004    (JP)    ............... 2004-285461

(51) Int. Cl.
    *H01L 21/26*    (2006.01)
(52) U.S. Cl. .............. 438/517; 438/519; 438/522; 438/530; 438/763; 438/779; 257/616; 257/635; 257/636; 257/742
(58) Field of Classification Search ........ 438/517–519, 438/522, 530, 761, 763, 778, 779, FOR. 394, 438/FOR. 395, FOR. 398, FOR. 400; 257/616, 257/632, 635, 636, 742
    See application file for complete search history.

(56) References Cited

U.S. PATENT DOCUMENTS 6,624,483 B2    9/2003 Kurata

2004/0070051 A1* 4/2004 Sugiyama et al. .......... 257/616
2004/0256639 A1* 12/2004 Ouyang et al. ............. 257/202
2005/0006637 A1* 1/2005 Iinuma et al. ................ 257/19
2005/0090066 A1* 4/2005 Zhu et al. .................... 438/300

FOREIGN PATENT DOCUMENTS

JP    2002-26318 A    1/2002

OTHER PUBLICATIONS

Hwa Sung Rhee, et al., "A New Double-Layered Structure for Mass-Production-Worthy CMOSFETs with Poly-SiGe Gate", 2002 Symposium On VLSI Technology Digest of Technical Papers, 2002, pp. 126-127.
S. Shimizu et al., "Gate Electrode Engineering by Control of Grain Growth for High Performance and High Reliable 0.18μm Dual Gate CMOS", 1997 Symposium on VLSI Technology Digest of Technical Papers, 1997, pp. 107-108.

* cited by examiner

*Primary Examiner*—Matthew Smith
*Assistant Examiner*—Joannie Adelle Garcia
(74) *Attorney, Agent, or Firm*—Foley & Lardner LLP

(57) ABSTRACT

A semiconductor device suitable for the miniaturization and comprising properly controlled Si/SiGe gate electrode comprises an insulator formed on a semiconductor substrate, a first gate electrode formed on the insulator and including silicon-germanium, wherein a germanium concentration is higher near an interface to the insulator and lower in a surface side opposite to the insulator, and a second gate electrode formed on the insulator and including silicon-germanium, wherein a germanium concentration is substantially uniform and an n-type dopant of a concentration of above $6 \times 10^{20}$ atoms/cm$^3$ is contained.

20 Claims, 7 Drawing Sheets

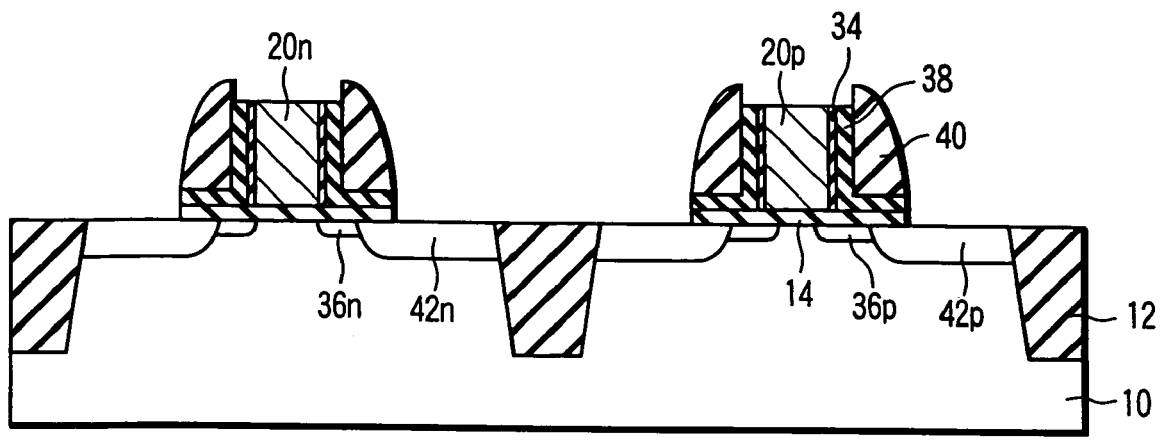
F I G. 5A
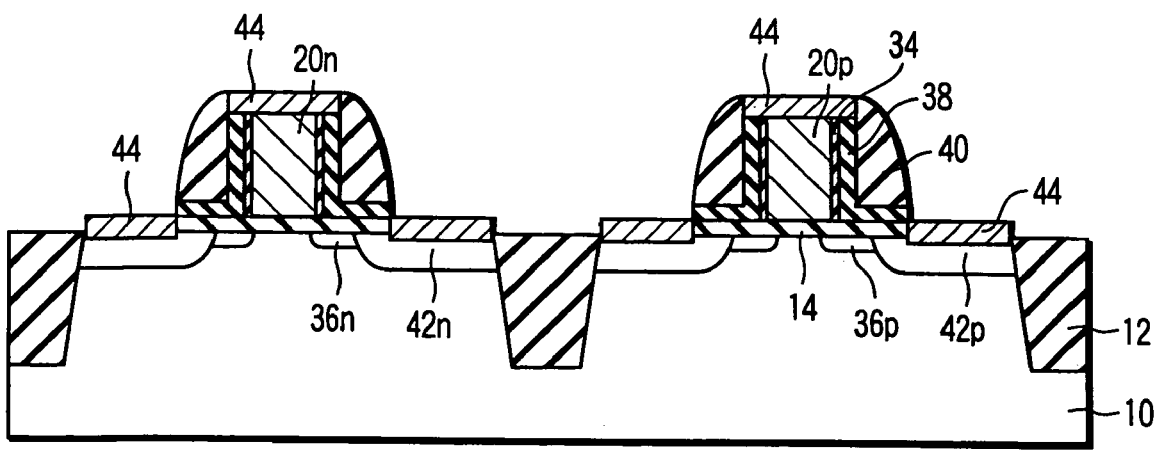
F I G. 5B

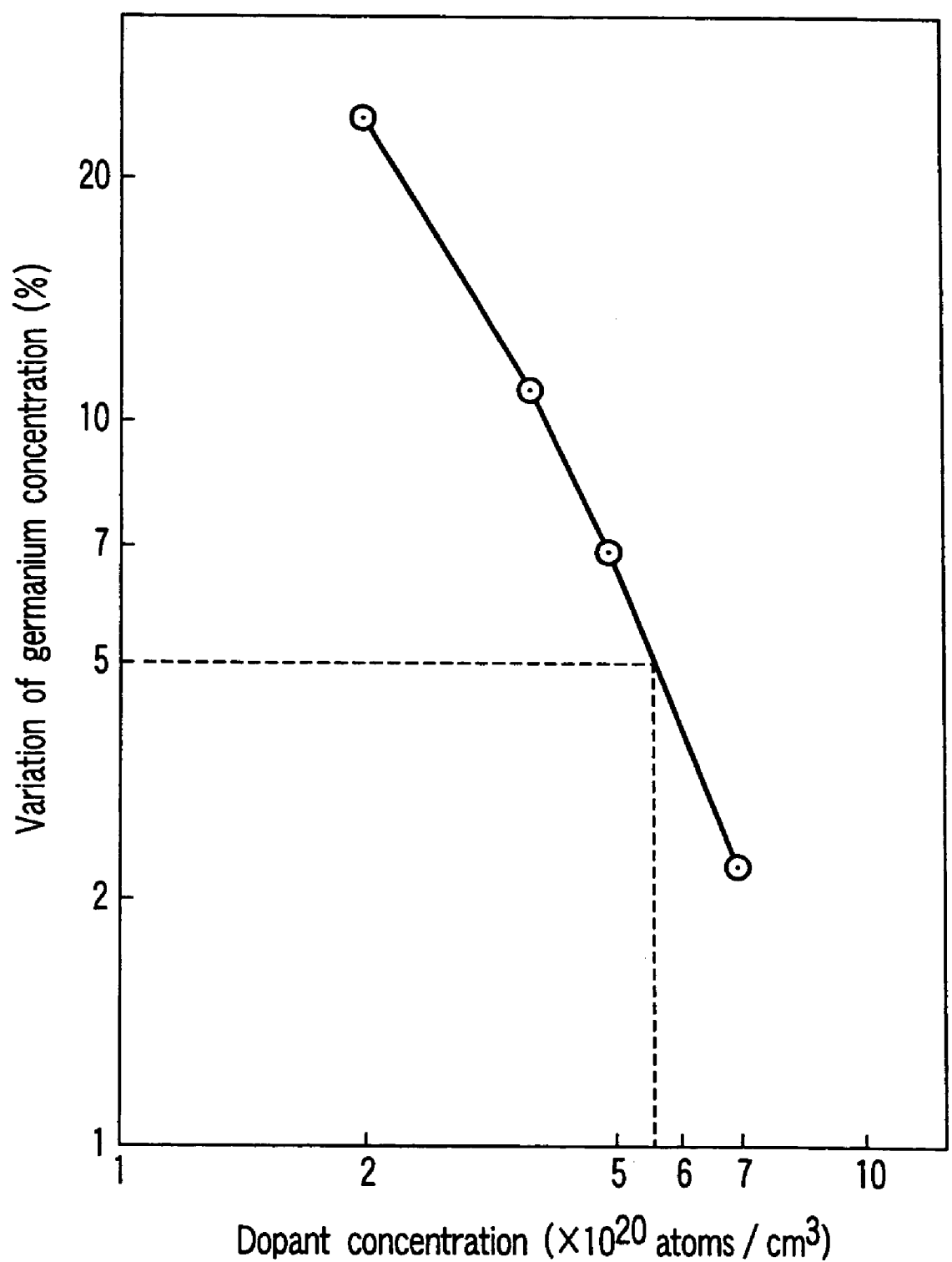
F I G. 6

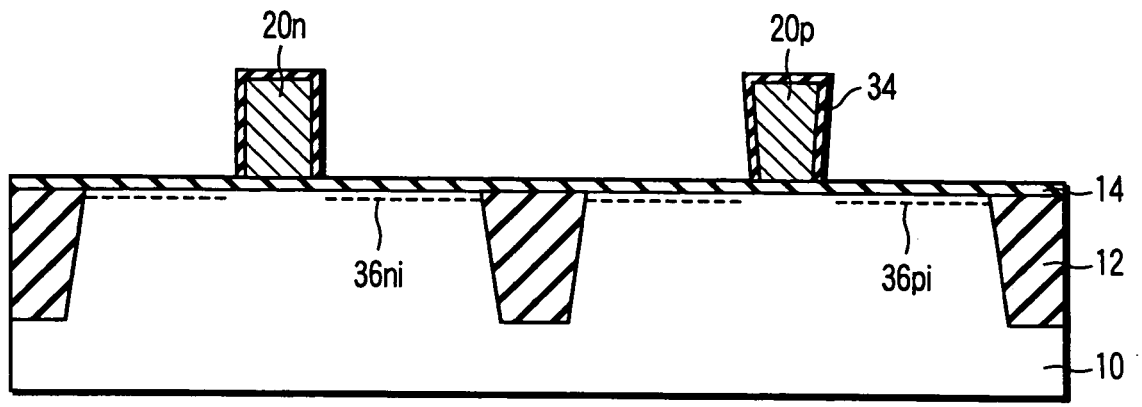
F I G. 9A
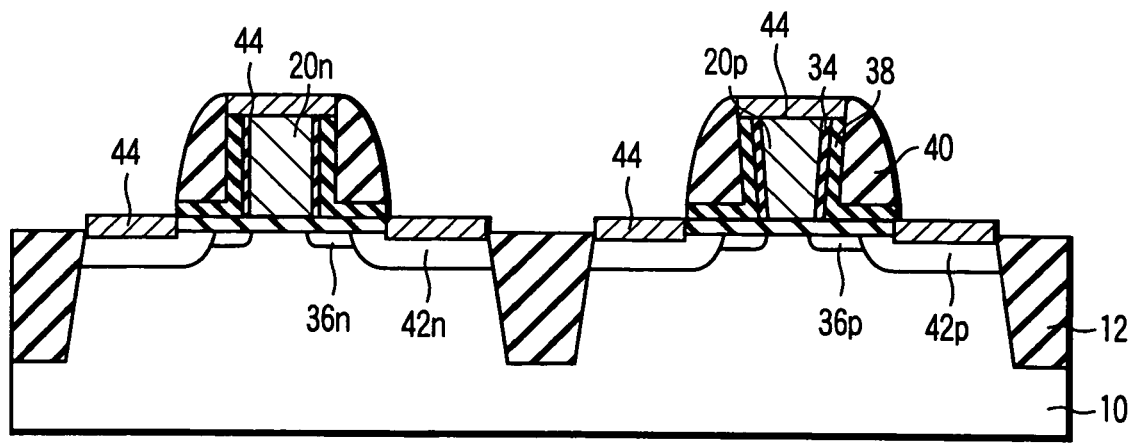
F I G. 9B

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2004-285461, filed Sep. 29, 2004, the entire contents of which are incorporated herein by reference.

BACKGROUND OF THE INVENTION

1. Field of the Invention

The present invention relates to a semiconductor device and a method for manufacturing the same, and more particularly, to a semiconductor device comprising a silicon and silicon-germanium stacked film structure suitable to miniaturization of a gate electrode and a method for manufacturing the same.

2. Description of the Related Art

Attention has now been paid to the technique of using a silicon and silicon-germanium stacked film (hereinafter referred to as an Si/SiGe) as a gate electrode of MOSFET (metal oxide semiconductor field effect transistor (hereinafter referred to as MOS)). A properly formed Si/SiGe gate electrode has various advantages, for example, suppressing a formation of a depletion layer in the gate electrode and improving current driving capability of p-type MOSFET (hereinafter referred to as pMOS).

However, there is a problem that resistance of a silicide being formed on the gate electrode is increased if the Ge concentration in the upper surface of the gate electrode is increased. Thus the surface Ge concentration of the gate electrode prior to the formation of the silicide is preferably low. In order to solve this problem, a technique for forming a poly-Si layer on the SiGe layer is disclosed in JPN PAT APPLN KOKAI PUBLICATION NO. 2002-26318. The patent further discloses another technique for controlling a cross-sectional configuration of the gate electrode by thermally oxidizing the gate electrode to provide a T-shaped gate configuration. However, no reference is made to the application of this technique to the complementary MOSFET (hereinafter referred to as a CMOS).

In order to apply the SiGe gate electrode to CMOS, there are further problems to be solved. To improve the current driving capability of pMOS, it is preferable to increase the Ge concentration in the gate electrode, in particular, near an interface to the gate insulator. In nMOS, however, if the Ge concentration near the interface to the gate insulator is increased, the current driving capability is lowered, thus presenting a problem just opposite to that in pMOS. Therefore, there remains a task to be solved, that is, a task such that the Ge concentration in the gate electrode is properly controlled in pMOS and nMOS, respectively.

A technique to control Ge concentration profiles in the Si/SiGe gate electrode of pMOS and nMOS in CMOS is disclosed by Hwa Sung Rhee et. al. in a paper entitled "A New Double-Layered Structure for Mass-Production-Worthy CMOSFETs with Ploy-SiGe Gate", 2002 Symposium on VLSI Technology Digest of Technical Papers, 13.3, pp. 126–127. That is, by controlling a polycrystalline structure in a p-type gate electrode, the polycrystalline structure is formed to be different from that in an n-type gate electrode. As a result, the Ge concentration in the SiGe film in the p-type gate electrode is maintained at a higher level. That is, when the Si/SiGe gate electrode is crystallized, the crystal grain size in the lower SiGe layer is made smaller in pMOS while the crystal grain size of the upper Si layer is made larger in pMOS. In nMOS, the crystal grain size is not controlled, so that the lower SiGe layer and upper Si layer both have a smaller crystal grain size. In this way, density of a crystal grain boundary, which acts as a diffusion path of Ge in the gate electrode, is controlled to less in pMOS gate electrode and more in nMOS gate electrode. As a result, the Ge concentration near a gate electrode/gate insulator interface can be made higher only in pMOS gate electrode. To provide the above-mentioned crystal grain size distribution, pMOS gate electrode is formed not as a conventional continuous deposition of polycrystalline SiGe film and polycrystalline Si film but as a four-layered deposition including a lower polycrystalline SiGe film, an intermediate amorphous Si film, an intermediate amorphous SiGe film and an upper amorphous Si film. Then the four-layered structure is crystallized to form a controlled crystal grain size described above. For this reason, the manufacturing process becomes complex, thus presenting a problem.

With the miniaturization of the CMOS semiconductor device, a problem occurs in the formation of an extension of a source/drain near edge of the gate electrode to lessen a short channel effect. In the conventional method for providing an extension by implantation after the formation of the gate electrode, horizontal diffusion length of the extension below the gate electrode is greater in pMOS than in nMOS, so that their overlap amounts are different. This is caused by the difference in diffusion coefficient between p-type and n-type dopants introduced into the extensions. To solve the problem, for example, proposals are made by which, a thicker offset spacer is formed in pMOS than in nMOS after the formation of the gate electrode, a heat treatment of pMOS is made at a lower temperature than that of nMOS, or the like. Even in either case, the complex process or lowering of a device performance is unavoidable.

Therefore, there is a need for a gate electrode and its formation technique suitable to the miniaturized CMOS semiconductor device. For pMOS and nMOS, there is a growing demand for a technique for properly controlling a Ge concentration in the respective Si/SiGe electrode as well as the technique for properly controlling an overlap amount between the extension and the gate electrode.

BRIEF SUMMARY OF THE INVENTION

According to an aspect of the present invention, a semiconductor device comprises: an insulator formed on a semiconductor substrate; a first gate electrode formed on the insulator and including silicon-germanium, wherein a germanium concentration is higher near an interface to the insulator and lower in a surface side opposite to the insulator; and a second gate electrode formed on the insulator and including silicon-germanium, wherein a germanium concentration is substantially uniform and an n-type dopant of a concentration of above $6 \times 10^{20}$ atoms/cm$^3$ is contained.

According to another aspect of the present invention, a semiconductor device comprises: an insulator formed on a semiconductor substrate; a first gate electrode formed on a semiconductor substrate and including silicon-germanium, wherein a germanium concentration is higher near an interface to the insulator and lower in a surface side opposite to the insulator, and at least one of carbon, nitrogen or oxygen of a concentration of above $1 \times 10^{15}$ atoms/cm$^2$ but below $1 \times 10^{16}$ atoms/cm$^2$ is contained; and a second gate electrode formed on the insulator and including silicon-germanium, wherein a germanium concentration is substantially uniform and an n-type dopant of a concentration of above $6 \times 10^{20}$ atoms/cm$^3$ is contained.

According to further aspect of the present invention, a method for manufacturing a semiconductor device comprises: forming an insulator on a semiconductor substrate; forming a first silicon film on the insulator; forming a semiconductor film containing silicon and germanium on the first silicon film; forming a second silicon film on the semiconductor film; introducing an n-type dopant of a concentration of above $6 \times 10^{20}$ atoms/cm$^3$ into at least the second silicon film in a second gate electrode forming area; forming first and second gate electrodes by processing the first silicon film, semiconductor film and second silicon film; and heat treating the semiconductor substrate with the first and second gate electrodes formed thereon to allow the germanium in the first and second gate electrodes to be redistributed within each gate electrode to a distribution different each other.

According to still another aspect of the present invention, a method for manufacturing a semiconductor device comprises: forming an insulator on a semiconductor substrate; forming a first silicon film on the insulator; forming a semiconductor film containing silicon and germanium on the first silicon film; forming a second silicon film on the semiconductor film; introducing an n-type dopant of a concentration of above $6 \times 10^{20}$ atoms/cm$^3$ into at least the second silicon film in a second gate electrode forming area; heat treating the semiconductor substrate to allow the germanium in the first and second gate electrodes to be redistributed within each gate electrode to a distribution different each other; forming first and second electrodes by processing the first silicon film, semiconductor film and second silicon film; and laterally etching the first gate electrode to make a width in a channel direction near an interface of the gate electrode to the insulator narrower than that at a surface side thereof.

BRIEF DESCRIPTION OF THE SEVERAL VIEWS OF THE DRAWING

FIGS. 5A and 5B are views for explaining one example of the manufacturing method of the semiconductor device subsequent to FIG. 4B;

FIG. 6 is a chart showing a relation between a dopant concentration introduced in the Si/SiGe gate electrode of an nMOS and a variation of germanium concentration in the Si/SiGe gate electrode;

FIGS. 9A and 9B are views for explaining one example of the manufacturing method of the second embodiment subsequent to FIG. 8B.

DETAILED DESCRIPTION OF THE INVENTION

Figure 1A:
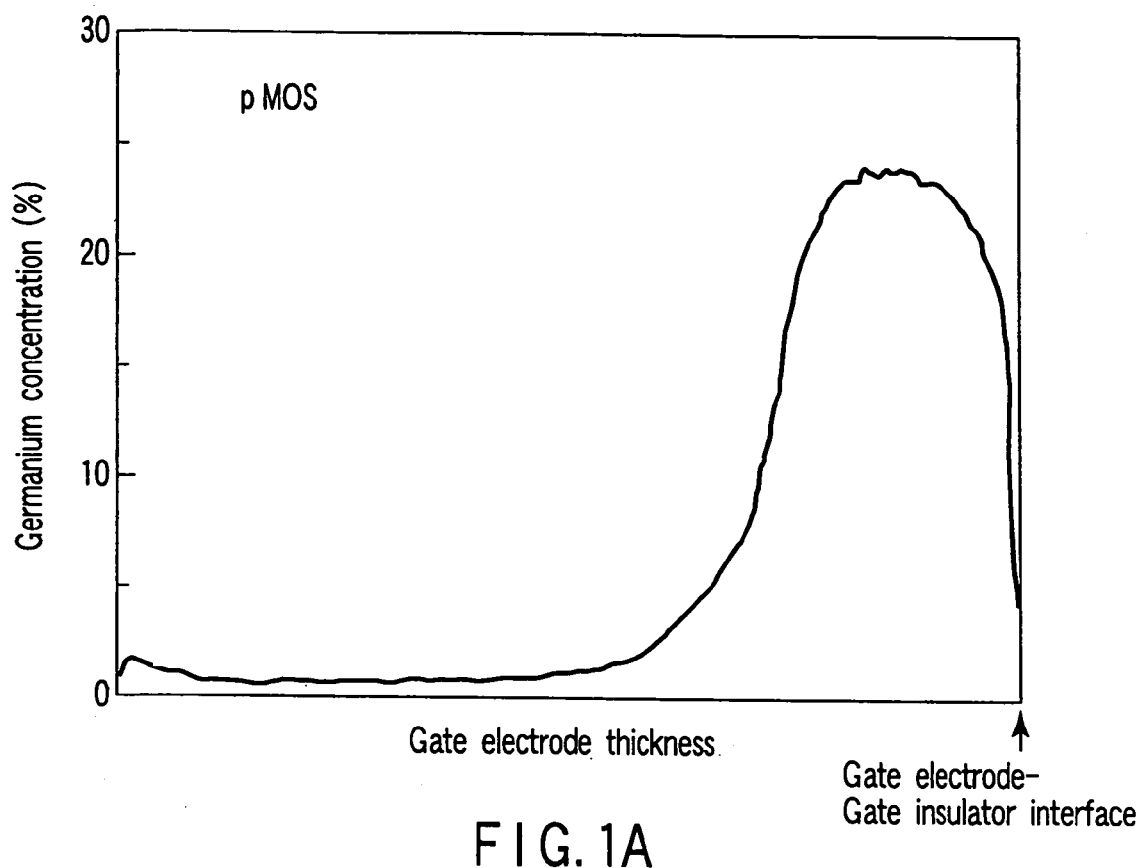
FIGS. 1A and 1B are charts for explaining germanium concentration distributions in Si/SiGe gate electrodes of a semiconductor device according to a first embodiment of the present invention, FIG. 1A being a chart showing one example of a germanium concentration distribution in a pMOS gate electrode and FIG. 1B being an example showing a germanium concentration distribution in an nMOS gate electrode.

The present invention is directed to provide a solution to the above-mentioned miniaturization problem in a CMOS semiconductor device by properly controlling a Ge concentration distribution in an Si/SiGe gate electrode and a configuration of the gate electrode in pMOS and nMOS, respectively, and to make a miniaturization of the device easier.

With reference to the accompanying drawing, an explanation will be made in more detail below about the embodiment of the present invention and, throughout the present embodiments, the same reference numerals are employed to designate corresponding parts or elements.

(First Embodiment)

A first embodiment is a CMOS semiconductor device in which a Ge concentration in an Si/SiGe gate electrode is controlled to have a desired concentration distribution in pMOS and nMOS, respectively. It is achieved by individually controlling a dopant species, as well as their concentration, doped to the gate electrode of pMOS and nMOS before crystallizing an amorphous Si layer formed on an SiGe layer.

Figure 1B:
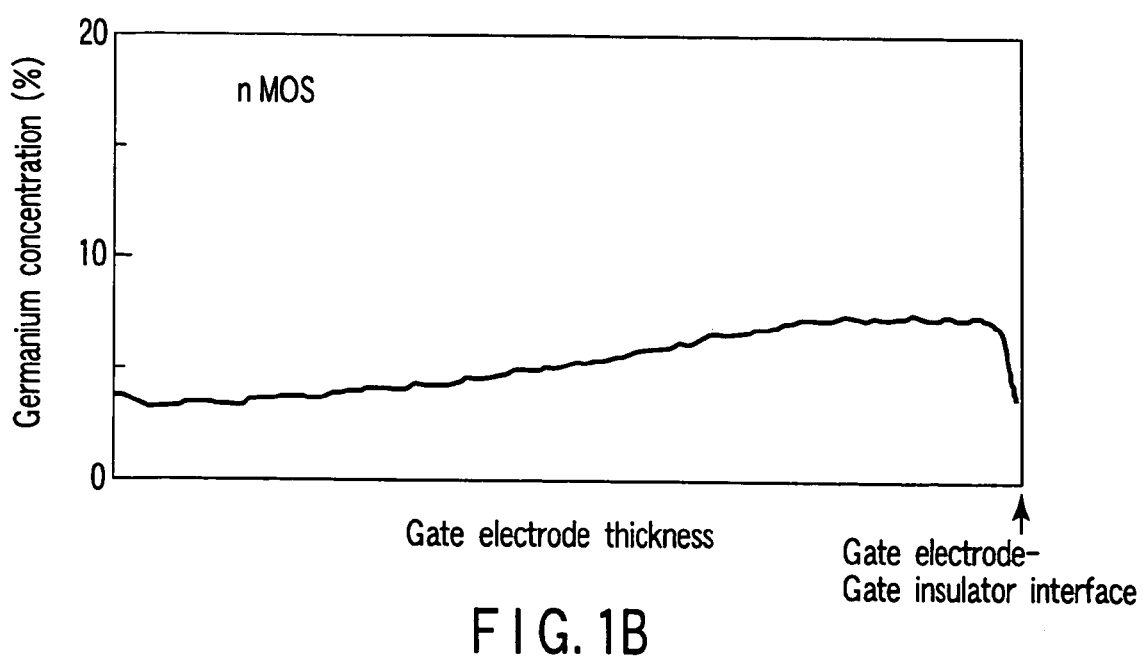

One example of the Ge concentration distribution in the Si/SiGe gate electrode according to the present embodiment is shown in FIGS. 1A and 1B. FIG. 1A shows one example of a Ge concentration distribution in the gate electrode in pMOS and FIG. 1B shows one example of a Ge concentration distribution in the gate electrode in nMOS.

In the Figures, the horizontal axis shows a gate electrode thickness, the right end showing a gate electrode and a gate insulator interface and the left end showing a surface. The vertical axis shows the germanium atomic concentration in the gate electrode. As evident from the figure, in pMOS, a peak of the Ge concentration is present in the gate electrode near the gate electrode and gate insulator interface and a low Ge concentration is present in the surface side to show a large variation in Ge concentration. In nMOS, on the other hand, a substantially uniform Ge concentration distribution is present as a whole, but the Ge concentration is somewhat higher near the interface to the gate insulator and gradually lowered in the surface side to show a less variation in Ge concentration.

From the standpoint of the current driving capability of a MOSFET, a Ge atomic concentration in the Si/SiGe gate electrode in the vicinity of the interface to the gate insulator is preferably in a range of above 15% but below 50% for pMOS and in a range of below 10% for nMOS. The upper limit of the Ge concentration in pMOS is based on an easiness in a processing, such as an etching, of the gate electrode. The Ge concentration in the surface side is preferably below 5% for either of pMOS and nMOS. This is based on an easiness of the formation of a silicide on the gate electrode.

The method for manufacturing the CMOS semiconductor device comprising Si/SiGe gate electrode with a different Ge concentration distribution in pMOS and nMOS as described above will be explained below, by way of example, with reference to FIGS. 2A through 5B. The present embodiment is described below to help an understanding of the present invention and it is not intended to restrict a scope of the present invention.

Figure 2A:
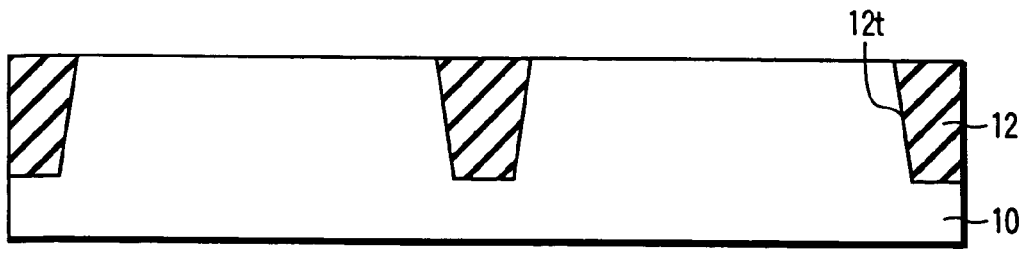
FIGS. 2A and 2B are views for explaining one example of a manufacturing method of a semiconductor device according to the first embodiment of the present invention.

(1) First, as shown in FIG. 2A, an isolation 12 and well (not shown) are formed in a semiconductor substrate 10, such as a silicon substrate. The isolation 12 may be, for example, an STI (shallow trench isolation) by forming a shallow isolation trench 12t in the silicon substrate 10 and filling the trench with an oxide film. In place of the STI, it may also be formed the isolation 12 by a LOCOS (local oxidation of silicon). Impurities for well are implanted in a pMOS and an nMOS region, respectively, then an annealing is carried out to form wells, not shown, in the silicon substrate 10.

Figure 2B:
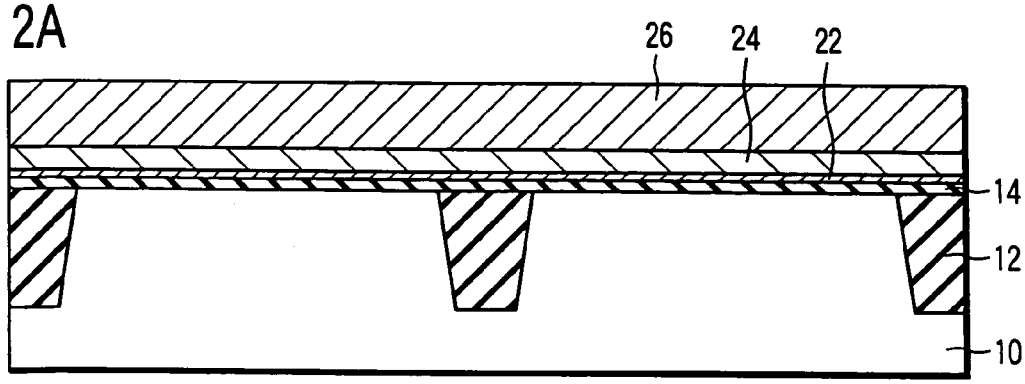

(2) Next, as shown in FIG. 2B, a gate insulator 14 is formed on an entire surface of the silicon substrate 10. As the gate insulator 14, a silicon oxide ($SiO_2$) film formed by thermal oxidation or CVD (chemical vapor deposition), CVD-silicon nitride (SiN) film, silicon oxy-nitride (SiON) film formed by oxidizing an SiN film, or a high-permittivity insulator, such as tantalum oxide ($Ta_2O_5$) film having a permittivity higher than that of the $SiO_2$ film may be used. Then a first silicon (Si) film 22, a silicon germanium (SiGe) film 24 and a second Si film 26 are sequentially deposited on the gate insulator 14. The first Si film 22 is a thin Si film called a seed Si film and is used to uniformly deposit the SiGe film 24 on it.

The SiGe film 24 is only need to be formed to contain Si and Ge and any composition can be used. Its crystal grain structure just after the film formation is preferably to be a columnar structure. By forming the SiGe film 24 in the columnar structure, an activation rate of dopant in the gate electrode is become higher than that in other structures, such as an amorphous or a structure with a small grain. In addition, when the second Si film 26 deposited on the SiGe film 24 is formed in amorphous, a sheet resistance of the silicide to be formed on the gate electrode becomes low as will be described below. The Ge atomic concentration (peak concentration) in the SiGe at the formation is desirably in a range of above 15% but below 50%. The Ge concentration of above 15% is necessary to achieve a raised activation rate of a dopant for pMOS and the range of below 50% is necessary for the SiGe film 24 not to be etched in a wet etching of a gate electrode processing later. More preferably, the Ge concentration is above 20%.

Further, the second Si film 26 formed on the SiGe film 24 can be preferably formed in amorphous than in other crystal structure, such as a small grain, or columnar structure, etc. This is because that, in the formation of the SiGe gate electrode, the effect of suppressing the diffusion of Ge in the gate electrode is highest in the amorphous Si film.

Moreover, it is preferable to set the thickness ratio between the second Si film 26 and the SiGe film 24 (i.e., Si film 26 thickness/SiGe film 24 thickness) to be more than 3. By making the second Si film 26 thicker, the distribution of the Ge concentration in the gate electrode for pMOS and nMOS can be varied greatly, as described above.

(3) Then, a dopant for enhancing redistribution of Ge is being implanted into the Si/SiGe film in an nMOS formation area.

Figure 3A:
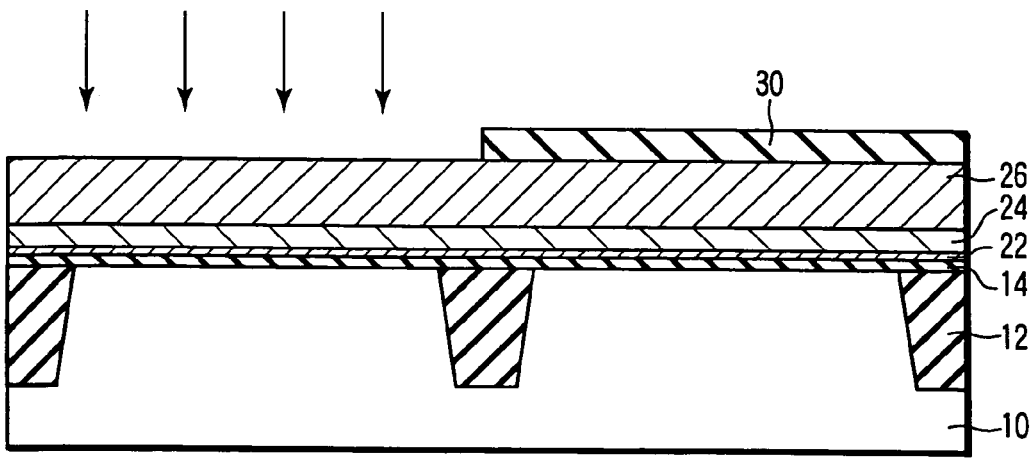
FIGS. 3A and 3B are views for explaining one example of the manufacturing method of the semiconductor device according to the first embodiment subsequent to FIG. 2B.

Specifically, as shown in FIG. 3A, an area other than nMOS formation area is covered with a resist 30 by means of lithography. With the resist 30 as a mask, an n-type dopant, such as arsenic (As) or phosphorus (P), is implanted into at least the second Si film 26 in the nMOS formation area. It may be allowed to implant the ion not only into the second Si film 26 but also into the SiGe film 24. It is preferable that the implanted dopant concentration is above $6 \times 10^{20}$ atoms/cm$^3$, as will be described below. Further, an additional implantation may be done so as to make the crystallinity of the second Si film 26 in amorphous more completely. As an element to be implanted, Group IV element in the periodic table, such as Si or Ge, is preferable but other elements such as tin (Sn) may be used. The dose of the implantation depends on the element, that is, an element with a large mass enables to make the Si film 26 amorphous with a less dose. The additional implantation can be omitted if the second Si film 26 has been made adequately in amorphous by the prior n-type dopant implantation.

Figure 3B:
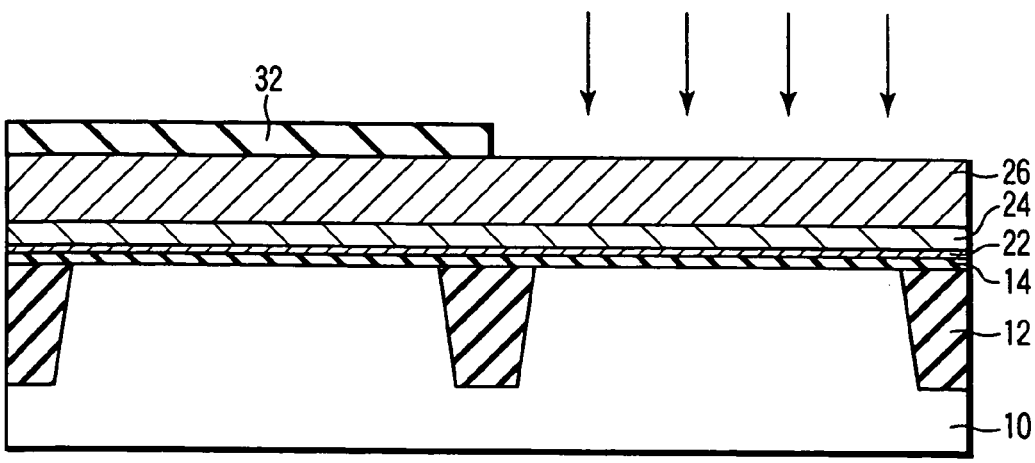

(4) Then a doping is executed to a pMOS formation area. As shown in FIG. 3B, as in the case of the nMOS area, an area other than the pMOS formation area is covered with a resist 32 by lithography. With the resist 32 as a mask, a p-type dopant, such as boron B, is implanted at least into a second Si film 26 in the pMOS formation area. It is preferable that the implanted B does not reach to the SiGe film 24. Then at least one of, for example, nitrogen (N), carbon (C) or oxygen (O) is implanted into the second Si film 26. These dopants serve to suppress the diffusion of the Ge into the second Si film 26 in a subsequent crystallization of the gate electrode. The dose of the implantation is preferably in a range of above $1 \times 10^{15}$ atoms/cm$^2$ but below $1 \times 10^{16}$ atoms/cm$^2$. It may be omitted either one or both of the implantation of the p-type dopant and that of the diffusion suppressing dopant of Ge.

The implantation processes (3) and (4) as described above can be changed properly in their order within their steps and between their steps.

(5) Then the Si/SiGe film is being processed to provide a gate electrode 20. A pattern of the gate electrode 20 is formed by means of lithography on a resist, not shown, formed on the second Si film 26. With this resist as a mask, the second Si film 26, SiGe film 24 and first Si film 22 are etched off sequentially by anisotropic dry etching (RIE; reactive ion etching) to form a gate electrode 20. The cross-sectional configuration of the thus formed gate electrode 20 has an almost vertical sidewall in both pMOS and nMOS and substantially no difference between them. The processing of the gate electrode 20 can also be performed by using a so-called hard mask, which transfers the resist pattern of the gate electrode 20 to, for example, an SiN film or $SiO_2$ film, in place of the above-mentioned resist mask.

Subsequently, annealing is performed at a temperature of, for example, 950° C. to 1100° C. in a non-oxidizing atmosphere, such as nitrogen. By this annealing, the dopants implanted into the gate electrodes are electrically activated and, at the same time, the second Si film 26 is crystallized to redistribute the Ge in the SiGe film 24 within the Si/SiGe gate electrode. During the redistribution of Ge, due to the respective effects of the dopants implanted in the prior processes (3) and (4), in the gate electrode of pMOS 20p and in the gate electrode of nMOS 20n, it can be provided desired Ge concentration distributions different each other, respectively. Specifically, in pMOS, since a dopant for suppressing the diffusion of the Ge is implanted in the Si/SiGe film, the Ge concentration in the gate electrode 20p reveals a peak near the gate electrode and gate insulator film interface, and is low in the surface side, thus providing a greater variation in the Ge concentration within the gate electrode 20p. On the other hand, in nMOS, the dopant for enhancing the diffusion of Ge is provided in the Si/SiGe film and, therefore, the Ge concentration is substantially uniform as a whole and provides a distribution of a smaller variation in the Ge concentration. More precisely, the Ge concentration is somewhat higher near the interface to the gate insulator.

Moreover, the crystal grain size in the crystallized gate electrode 20 differs between pMOS and nMOS. The gate electrode of nMOS 20n is larger in its crystal grain size than the gate electrode of pMOS 20p. This is because, before annealing, the n-type dopant of a high concentration is implanted in the gate electrode of nMOS 20n and the second Si film 26 is in an adequately amorphous state. Thus the crystal grain grows larger in the nMOS gate electrode than that in the pMOS in the annealing. The present crystal grain size distribution is just opposite to the distribution in the aforementioned paper by Hwa Sung Rhee et. al., where the crystal grain size in the gate electrode of pMOS becomes larger than that in the gate electrode of nMOS.

The annealing temperature is preferably higher than 950° C. in order to obtain a greater activation rate of the dopant which is implanted into the gate electrode 20 and preferably lower than 1100° C. in order to prevent the configuration of the gate from being deformed.

Further, the annealing can be omitted but, in this case, it is done by annealing for source/drain activation, etc, processed later.

Figure 4A:
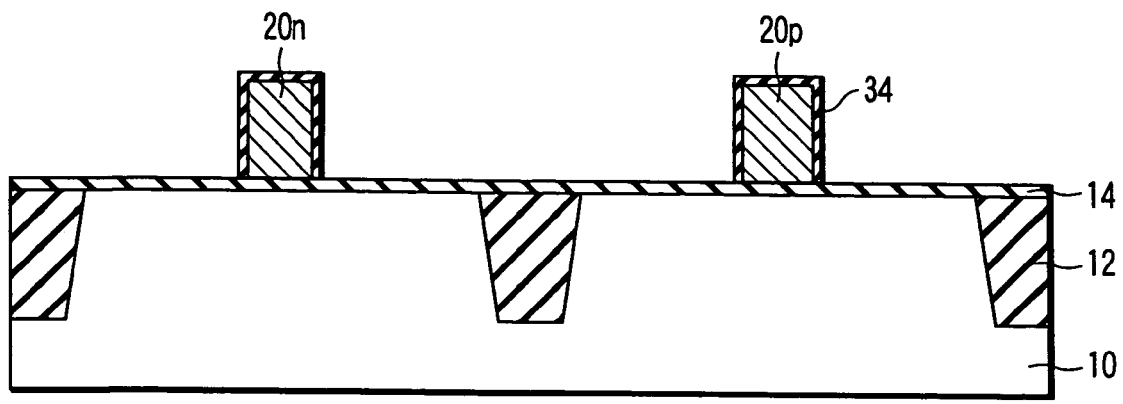
FIGS. 4A and 4B are views for explaining one example of the manufacturing method of the semiconductor device subsequent to FIG. 3B.

Then, the gate electrode is oxidized slightly to provide a thin post-oxide film 34. The post-oxide film 34 is provided so as to improve the reliability of the gate insulator 14. In this way, it can be provided a structure as shown in FIG. 4A.

(6) Next, a shallow but lower concentration source/drain, that is, an extension 36, is being provided.

Figure 4B:
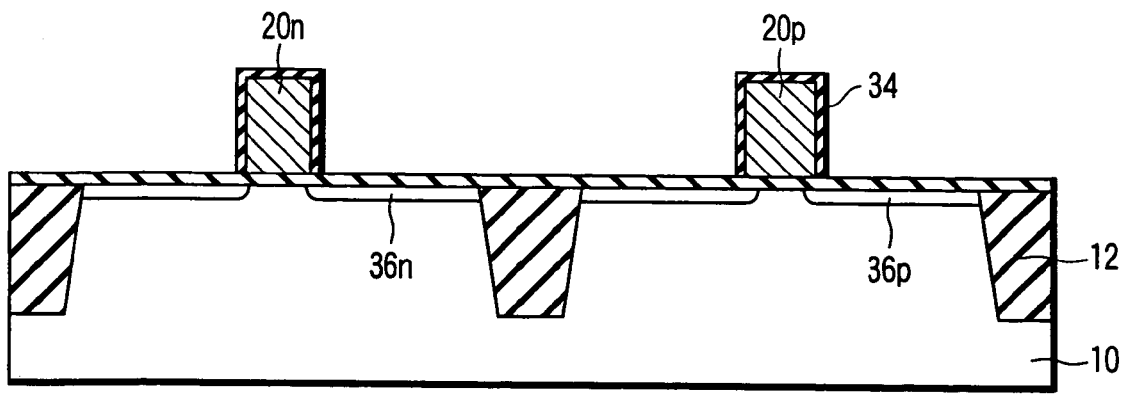

Specifically, using the gate electrode 20 as a mask, a p-type dopant such as boron (B) is implanted at a low energy into the pMOS area and an n-type dopant such as arsenic (As) into the nMOS area. Then annealing is executed to activate the implanted dopants and to provide extensions 36p, 36n with a lower dopant concentration and shallower in depth. In this way, the extension 36 is provided as shown in FIG. 4B.

Since the diffusion of boron in the activation annealing is faster than that of arsenic, a so-called offset spacer can be formed on the side surface of the gate electrodes 20p, 20n for the implantation. The offset spacer is a set of spacers in which the spacer on the gate electrode of pMOS 20p is thicker than that of nMOS 20n. By using the offset spacer, an overlapping between the extension 36 and the gate electrode 20 in pMOS and nMOS can be adjusted to a substantially equal amount.

(7) Then sidewalls 38, 40 are being formed on the side surface of the gate electrodes 20. First, a second $SiO_2$ film 38 is formed on an entire surface, for example, by CVD. Then an SiN film 40 is formed on the $SiO_2$ film 38. By using the second $SiO_2$ film 38 as a stopper, the SiN film 40 is etched by RIE to leave the SiN film 40 only on the side surface of the gate electrode 20. And by using the silicon substrate 10 as a stopper, the second $SiO_2$ film 38 is similarly etched by the RIE to expose the silicon substrate 10. In this way, a two-layered sidewall consisted of the second $SiO_2$ film 38 and SiN film 40 is formed on the side surface of the gate electrode 20, as shown in FIG. 5A. During the sidewall formation process, the SiN film 40 and second $SiO_2$ film 38 on the top surface of the gate electrode 20 are simultaneously removed to expose the top surface of the gate electrode 20.

Though the sidewall 38, 40 was explained here as two-layered, other sidewall structure can be formed such as a single layer or a multi-layer structure having three or more layers. The step of removing the second $SiO_2$ film 38 can be done prior to a step (9) of forming a silicide 44.

(8) Then a source/drain 42 is being formed. Specifically, by using the gate electrode 20 and gate sidewalls 38, 40 as a mask, a p-type dopant such as boron (B) is implanted at a high concentration into pMOS area and an n-type dopant such as arsenic (As) into nMOS area. These implantations are done at higher energies and higher concentrations than those for the extensions 36 in the step (6). Then annealing is executed to activate the implanted dopant and provide source/drain 42p, 42n. The annealing is preferably a high-temperature rapid thermal annealing (RTA) or a spike annealing to allow activating the implanted dopant adequately and not increasing a diffusion depth to an unnecessary extent. Thus, it can be provided the source/drain 42p, 42n higher in dopant concentration and greater in diffusion depth than those of the extension 36.

(9) Then a silicide 44 is being formed on the source/drain 42 and on the gate electrode 20. The formation of the silicide 44 can be by a method of forming a metal film, such as cobalt (Co) or nickel (Ni), on the source/drain 42 and on the gate electrode 20 and annealing it to allow a reaction with an underlying silicon, or a method of directly forming a film of a predetermined silicide composition by means of sputtering or CVD, or other methods. In this way, it can be provided a structure as shown in FIG. 5B.

Furthermore, executing steps such as multilevel wiring necessary for the semiconductor device, the CMOS semiconductor device is completed.

Now an explanation will be given below about the concentration of the n-type dopant implanted into the gate electrode of nMOS 20n to enhance Ge diffusion as described above in the step (3). The n-type dopant concentration necessary to enhance the Ge diffusion can be determined experimentally. Redistribution of Ge in the Si/SiGe film is measured after annealing. An Si film is deposited on an SiGe film, then an n-type dopant is implanted into a resultant structure, as in the present embodiment, at several concentrations ranging between $2 \times 10^{20}$ atoms/cm$^3$ and $7 \times 10^{20}$ atoms/cm$^3$. FIG. 6 shows a relation between the implanted n-type dopant concentration and a variation of Ge concentration in the Si/SiGe film after annealing. In the Figure, horizontal axis represents an n-type impurity concentration and vertical axis represents a variation of Ge concentration. It will be understood from FIG. 6 that, as the n-type dopant concentration becomes higher, the Ge redistribution is enhanced and the variation of Ge concentration is decreased. In the gate electrode of nMOS 20n, the variation of Ge concentration is set preferably below 5%, as described above. Consequently, it can be given from FIG. 6 that the n-type dopant of above $6 \times 10^{20}$ atoms/cm$^3$ needs to be doped. For doping of the p-type dopant, though being not shown, no such enhanced Ge redistribution was measured even when the p-type dopant was doped with a concentration higher than $6 \times 10^{20}$ atoms/cm$^3$, and the variation of Ge concentration in the gate electrode of pMOS 20p remained large.

When the dopant is implanted into the gate electrodes 20p and/or 20n in two times, one before and one after the processing of the gate electrode 20, it can be independently designed doping concentrations in the gate electrode 20 and in the source/drain 42. Thus, it can be improved the activation rate of the dopant in the gate electrode 20 while suppressing a short channel effect resulting from an excess diffusion of the high concentration source/drain 42.

By implanting and annealing the n-type dopant of the concentration of above $6 \times 10^{20}$ atoms/cm$^3$ into the gate electrode of nMOS 20n electrode, it can be greatly differentiated the Ge concentration distribution in the Si/SiGe gate electrode 20 in nMOS and in PMOS. That is, as shown in FIG. 1, a CMOS semiconductor device, which has a substantially uniform Ge concentration distribution in nMOS gate electrode 20n and a desired Ge concentration distribution in pMOS gate electrode 20p with a high concentration in the vicinity of an interface to the gate insulator 14, can be formed From the standpoint of the MOSFET characteristics, in nMOS, the Ge atomic concentration in the Si/SiGe gate electrode 20 is preferably below 10% in the vicinity of the interface to the gate insulator 14. On the other hand, in pMOS, the Ge concentration is preferably in a range of above 15% but below 50% and more preferably is above 20%. The Ge concentration in the surface of the gate electrode 20 is preferably below 5% either in nMOS and pMOS. Therefore, the variation of Ge concentration in the gate electrode 20 is preferably below 5% for nMOS and above 15% for pMOS.

By implanting a dopant into the gate electrode 20 in two times, one before and one after the gate electrode processing (that is at the formation of the source/drain 42), as mentioned above, it can be improved the short channel characteristic of the MOSFET and also improved the activation rate of the dopant in the gate electrode 20.

In order to more positively suppress the redistribution of the Ge in pMOS gate electrode 20p, it is preferable to dope at least one of nitrogen, carbon or oxygen at a concentration of above $1 \times 10^{15}$ atoms/cm$^3$ but below $1 \times 10^{16}$ atoms/cm$^3$. It is considered due to suppression of a self-diffusion of Si atoms in the Si film by that impurity. When the self-diffusion of the Si atoms is suppressed, less Si atoms diffuse out of the Si film and, as a result, it becomes difficult the Ge atoms to diffuse into the Si film. That is, the redistribution of the Ge is suppressed.

According to the present embodiment, for pMOS, by setting the Ge concentration in the gate electrode 20p near the interface to the gate insulator 14 to be above 15% but below 50%, it can be improved the activation rate of the dopant and improved the current driving capability. For nMOS, on the other hand, the Ge concentration in the gate electrode 20n is set to be below 10% so as not to lower the current driving capability. Accordingly, it can be provided a CMOS semiconductor device of higher performance in both pMOS and nMOS.

According to the manufacturing method of the present embodiment, it is not necessary to selectively manufacture gate electrodes with an Si/SiGe stacked structure for PMOS and nMOS and, as a result, it can be prevented an increase in the manufacturing steps involved.

According to the embodiment of the present invention, as described above, it can be provided a Si/SiGe gate electrode structure suitable for a miniaturized CMOS semiconductor device and having a properly controlled Ge concentration distribution in pMOS and nMOS, respectively. Thus, it can be provided a CMOS semiconductor device with high performance.

(Second Embodiment)

Figure 7:
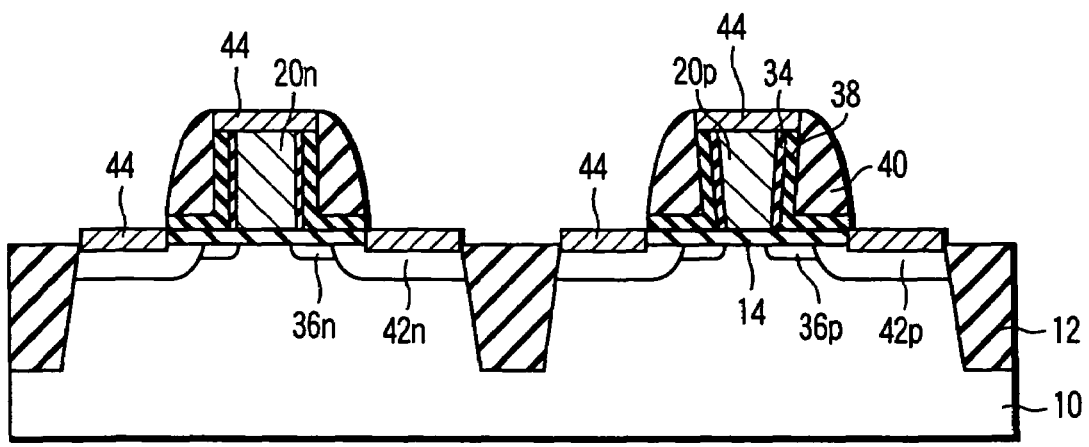
FIG. 7 is a view for explaining one example of a manufacturing method of a semiconductor device according to a second embodiment of the present invention.

The second embodiment provides a CMOS semiconductor device in which a Ge concentration distribution in Si/SiGe gate electrodes are properly controlled in pMOS and nMOS as in the case of the first embodiment and overlapped amounts between extensions 36 and gate electrodes 20 in pMOS and nMOS are controlled to a substantially equal amount. The overlapped amount is controlled by forming a gate electrode 20p to an inverted taper shape, as shown in FIG. 7.

A dopant implanted into the extension is generally boron (B) for pMOS and arsenic (As) for nMOS. Since a diffusion coefficient of boron is greater than that of arsenic when they are diffused in the same annealing, a lateral diffusion length of boron becomes greater than that of arsenic. The implantation for the extension is done generally by using the gate electrode as a mask. In order to adjust the difference of the lateral diffusion length, the gate electrode of PMOS is made to have an inverted taper shape with a lower side of the gate electrode narrower than an upper side of the gate electrode. On the other hand, the gate electrode of nMOS is made to have a vertical configuration as normal. By varying the shape of the gate electrodes 20, an overlapping between the extension 36 and the gate electrode 20 is made substantially equal for pMOS and nMOS.

With reference to FIGS. 8A through 9B, an example of the manufacturing process of the present embodiment will be explained below. The manufacturing process is substantially the same as that of the first embodiment except before and after the formation of the gate electrode. Therefore, an explanation will be omitted up to the process (4) of the first embodiment.

Figure 8A:
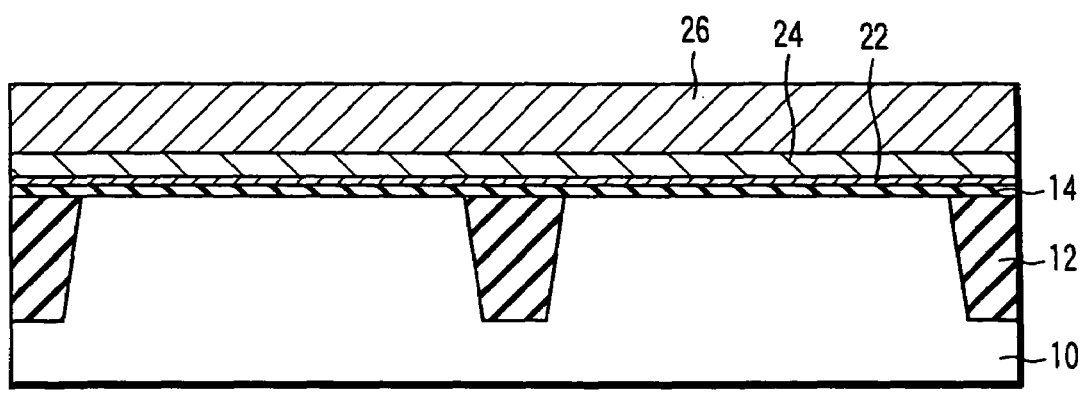
FIGS. 8A and 8B are views for explaining one example of the manufacturing method of the second embodiment.

FIG. 8A is a view showing just after the process (4) of the first embodiment, in which an n-type dopant, such as As, with a concentration of higher than $6 \times 10^{20}$ atoms/cm$^3$ is implanted into at least a second Si film 26 of an nMOS formation area and a Group IV element in the periodic table, such as Si, is implanted, as required, into the film so as to further make the second Si film 26 adequately amorphous. In the pMOS formation area, at least one of N, C or O is implanted with a concentration of above $1 \times 10^{15}$ atoms/cm$^2$ but below $1 \times 10^{16}$ atoms/cm$^2$ so as to suppress Ge diffusion from an SiGe film 24 into the second Si film 26.

(5) According to the present embodiment, prior to processing a gate electrode 20, an annealing is performed to allow the Ge in Si/SiGe film to be redistributed. Specifically, the thus implanted silicon substrate 10 is annealed at 950° C. to 1100° C. in a non-oxidizing atmosphere. As described above, in the annealing, due to the effects of the various kinds of dopants implanted in the previous step, it can be formed desired Ge concentration distributions in the pMOS formation area and nMOS formation area, respectively, different each other. That is, in the pMOS formation area, the Ge concentration distribution is such that the Ge concentration in the Si/SiGe stacked film is higher near the interface between the gate insulator film 14 and the Si/SiGe film and lower in the surface area. In the nMOS formation area, on the other hand, it can be provide a substantially uniform Ge distribution throughout. During the annealing, the interface between Si and SiGe films disappears.

Figure 8B:
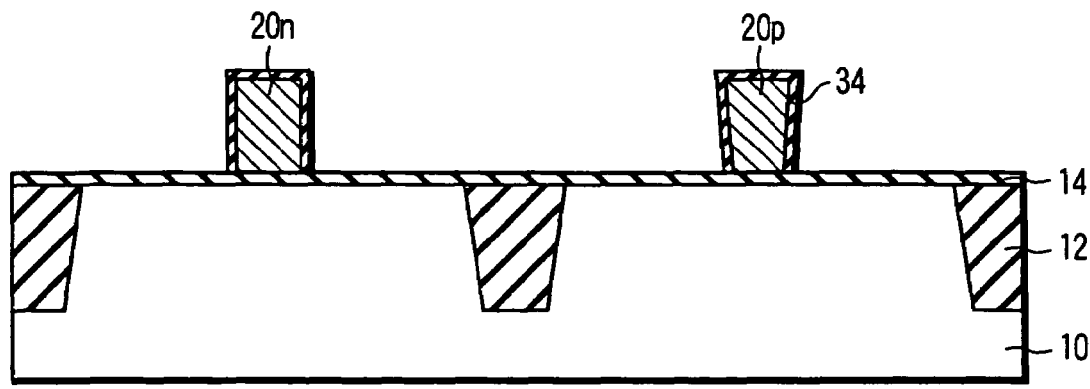

Then, the stacked film is processed to be a gate electrode 20. A resist, not shown, is provided on the stacked film 26/24/22 and a pattern of the gate electrode 20 is formed by the lithography in the resist. By using the resist as a mask, the stacked film 26/24/22 is processed by RIE etching. In the processing, an RIE condition is selected to enhance side etching at the higher Ge concentration portion. In this way, the gate electrode configuration for pMOS 20p, and for nMOS 20n, are formed differently, as shown in FIG. 8B. Specifically, in the gate electrode of pMOS 20p, since the Ge concentration is higher in a portion near the gate insulator 14, a width in the channel direction of the gate electrode 20p is narrower near the gate insulator than that in the surface side, thus a so-called inverted taper shape is formed.

The inverted taper shape can be formed even by a wet etching process. For example, after the gate electrode is formed vertically by RIE for both pMOS and nMOS, a selective etching is executed by adjusting the composition of an etching solution to enhance an etching rate at a higher Ge concentration portion. In this way, a side etching is enhanced only at a portion near the interface to the gate insulator 14 of the pMOS gate electrode 20p where the Ge concentration is higher. Thus the gate electrode 20p is formed in the inverted taper shape.

Then the gate electrode is slightly oxidized to form a thin post-oxide film 34. In this way, it can be provide the structure as shown in FIG. 8B (6) Then an extension 36 is formed.

An implantation is executed with the gate electrodes 20p, 20n as a mask. As shown in FIG. 9A, since the gate electrode of pMOS 20p has an inverted taper shape, a space can be provided between the edge of PMOS gate electrode 20p and the edge of an implanted layer for extension 36pi without using offset spacer. In nMOS, on the other hand, an edge of an implanted layer for extension 36ni is aligned to the edge of the gate electrode 20n.

Then, as in the case of the first embodiment, an activation annealing of extension 36, formation of sidewalls 38, 40, formation of source/drain 42 and formation of silicide 44 are executed to complete a CMOS device, as shown in FIG. 9B.

Furthermore, executing steps such as multilevel wiring necessary for the semiconductor device, the CMOS semiconductor device is completed.

As described above, in the pMOS, it can be provided the gate electrode 20p comprising the Ge concentration distribution higher near the interface to the gate insulator film 14 and lower in the surface side and the inverted taper shape. In the nMOS, it can be provided the gate electrode 20n comprising a substantially uniform Ge concentration distribution and a substantially rectangular cross-sectional shape.

Furthermore, according to the present embodiment, the gate electrode of pMOS 20p has the inverted shape, while the gate electrode of nMOS 20n has the rectangular shape. By adopting such a structure it can be increased an effective offset spacer width in pMOS even when offset spacers with the same thickness are used for both pMOS and nMOS. As a result, even if the same heat treatment is applied, the performance of the CMOS device is not impaired, thus it can be realized a CMOS semiconductor device with higher performance.

According to the present invention, when the second Si film 26/SiGe film 24 are simultaneously formed in pMOS area and nMOS area, the different Ge concentration distribution can be formed in the gate electrodes of pMOS 20p and nMOS 20n after the heat treatment. That is, it can be realized desired Ge concentration distribution in the respective gate electrodes. In this way, by utilizing the Ge concentration distribution, it can be provided the pMOS gate electrode 20p in the inverted taper shape.

As described above, according to the present invention, for the gate electrode suitable to the miniaturized CMOS semiconductor device, the Si/SiGe gate electrode in pMOS and nMOS can be formed to have the desirably controlled Ge concentration distribution and the desirable gate shape, respectively. Thus, the high performance CMOS semiconductor device can be provide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an insulator formed on a semiconductor substrate;
a first gate electrode formed on the insulator and including silicon-germanium, wherein a germanium concentration is higher near an interface to the insulator and lower in a surface side opposite to the insulator; and
a second gate electrode formed on the insulator and including silicon-germanium, wherein a germanium concentration is substantially uniform and an n-type dopant of a concentration of above $6 \times 10^{20}$ atoms/cm$^3$ is contained.

2. The semiconductor device according to claim 1, wherein the first gate electrode including the silicon-germanium has a germanium atomic concentration near the interface to the insulator is above 15% but below 50%, a germanium atomic concentration in the surface side is below 5%, and a germanium concentration variation in the first gate electrode is above 10%, and wherein the second gate electrode including the silicon-germanium has a germanium atomic concentration near the interface to the insulator is below 10%, a germanium atomic concentration in the surface side is below 5%, and a germanium concentration variation in the second gate electrode is below 5%.

3. The semiconductor device according to claim 1, wherein a crystal grain size in the second gate electrode is greater than that in the first gate electrode.

4. The semiconductor device according to claim 1, wherein a width of the first gate electrode in a channel direction at the interface to the insulator is narrower than that at the surface side and a difference between the width at the interface to the insulator and at the surface side in the first gate electrode is greater than that in the second gate electrode.

5. A semiconductor device comprising:
an insulator formed on a semiconductor substrate;
a first gate electrode formed on the semiconductor substrate and including silicon-germanium, wherein a germanium concentration is higher near an interface to the insulator and lower in a surface side opposite to the insulator, and at least one of carbon, nitrogen or oxygen of a concentration of above $1 \times 10^{15}$ atoms/cm$^2$ but below $1 \times 10^{16}$ atoms/cm$^2$ is contained; and
a second gate electrode formed on the insulator and including silicon-germanium, wherein a germanium concentration is substantially uniform and an n-type dopant of a concentration of above $6 \times 10^{20}$ atoms/cm$^3$ is contained.

6. The semiconductor device according to claim 5, wherein the second gate electrode is crystallized after being made into amorphous by implantation.

7. The semiconductor device according to claim 5, wherein the first gate electrode including the silicon-germanium has a germanium atomic concentration near the interface to the insulator is above 15% but below 50%, a germanium atomic concentration in the surface side is below 5%, and a germanium concentration variation in the first gate electrode is above 10%, and wherein the second gate electrode including the silicon-germanium has a germanium atomic concentration near the interface to the insulator is below 10%, a germanium atomic concentration in the surface side is below 5%, and a germanium concentration variation in the second gate electrode is below 5%.

8. The semiconductor device according to claim 5, wherein a crystal grain size in the second gate electrode is greater than that in the first gate electrode.

9. The semiconductor device according to claim 5, wherein a width of the first gate electrode in a channel direction at the interface to the insulator is narrower than that at the surface side and a difference between the width at the interface to the insulator and at the surface side in the first gate electrode is greater than that in the second gate electrode.

10. A method for manufacturing a semiconductor device comprising:
   forming an insulator on a semiconductor substrate;
   forming a first silicon film on the insulator;
   forming a semiconductor film containing silicon and germanium on the first silicon film;
   forming a second silicon film on the semiconductor film;
   introducing an n-type dopant of a concentration of above $6 \times 10^{20}$ atoms/cm$^3$ into at least the second silicon film in a second gate electrode forming area;
   forming first and second gate electrodes by processing the first silicon film, semiconductor film and second silicon film; and
   heat treating the semiconductor substrate with the first and second gate electrodes formed thereon to allow the germanium in the first and second gate electrodes to be redistributed within each gate electrode to a distribution different from each other.

11. The method for manufacturing a semiconductor device according to claim 10,
   wherein the first gate electrode including the silicon-germanium has a germanium atomic concentration near the interface to the insulator is above 15% but below 50%, a germanium atomic concentration in the surface side is below 5%, and a germanium concentration variation in the first gate electrode is above 10%,
   and wherein the second gate electrode including the silicon-germanium has a germanium atomic concentration near the interface to the insulator is below 10%, a germanium atomic concentration in the surface side is below 5%, and a germanium concentration variation in the second gate electrode is below 5%.

12. The method for manufacturing a semiconductor device according to claim 10, wherein a thickness of the second silicon film is three times or more thicker than that of the semiconductor film.

13. The method for manufacturing a semiconductor device according to claim 12,
   wherein the first gate electrode including the silicon-germanium has a germanium atomic concentration near the interface to the insulator is above 15% but below 50%, a germanium atomic concentration in the surface side is below 5%, and a germanium concentration variation in the first gate electrode is above 10%,
   and wherein the second gate electrode including the silicon-germanium has a germanium atomic concentration near the interface to the insulator is below 10%, a germanium atomic concentration in the surface side is below 5%, and a germanium concentration variation in the second gate electrode is below 5%.

14. The method for manufacturing a semiconductor device according to claim 12, further comprising:
   introducing at least one of carbon, nitrogen or oxygen of a concentration of above $1 \times 10^{15}$ atoms/cm$^2$ but below $1 \times 10^{16}$ atoms/cm$^2$ into at least the second silicon film in the first gate electrode forming area.

15. The method for manufacturing a semiconductor device according to claim 10, further comprising:
   introducing at least one of carbon, nitrogen or oxygen of a concentration of above $1 \times 10^{15}$ atoms/cm$^2$ but below $1 \times 10^{16}$ atoms/cm$^2$ into at least the second silicon film in the first gate electrode forming area.

16. The method for manufacturing a semiconductor device according to claim 15,
   wherein the first gate electrode including the silicon-germanium has a germanium atomic concentration near the interface to the insulator is above 15% but below 50%, a germanium atomic concentration in the surface side is below 5%, and a germanium concentration variation in the first gate electrode is above 10%,
   and wherein the second gate electrode including the silicon-germanium has a germanium atomic concentration near the interface to the insulator is below 10%, a germanium atomic concentration in the surface side is below 5%, and a germanium concentration variation in the second gate electrode is below 5%.

17. The method for manufacturing a semiconductor device according to claim 10, further comprising:
   implanting ions into at least the second silicon film in the second gate electrode forming area to make the second silicon film into amorphous.

18. A method for manufacturing a semiconductor device comprising:
   forming an insulator on a semiconductor substrate;
   forming a first silicon film on the insulator;
   forming a semiconductor film containing silicon and germanium on the first silicon film;
   forming a second silicon film on the semiconductor film;
   introducing an n-type dopant of a concentration of above $6 \times 10^{20}$ atoms/cm$^3$ into at least the second silicon film in a second gate electrode forming area;
   heat treating the semiconductor substrate to allow the germanium in the first and second gate electrodes to be redistributed within each gate electrode to a distribution different from each other;
   forming first and second electrodes by processing the first silicon film, semiconductor film and second silicon film; and
   laterally etching the first gate electrode to make a width in a channel direction near an interface of the gate electrode to the insulator narrower than that at a surface side thereof.

19. The method for manufacturing a semiconductor device according to claim 18,
   wherein the first gate electrode including the silicon-germanium has a germanium atomic concentration near the interface to the insulator is above 15% but below 50%, a germanium atomic concentration in the surface side is below 5%, and a germanium concentration variation in the first gate electrode is above 10%,
   and wherein the second gate electrode including the silicon-germanium has a germanium atomic concentration near the interface to the insulator is below 10%, a germanium atomic concentration in the surface side is below 5%, and a germanium concentration variation in the second gate electrode is below 5%.

20. The method for manufacturing a semiconductor device according to claim 18, wherein a thickness of the second silicon film is three times or more thicker than that of the semiconductor film.

* * * * *